United States Patent [19]
Merritt et al.

[11] Patent Number: 6,027,957
[45] Date of Patent: Feb. 22, 2000

[54] CONTROLLED SOLDER INTERDIFFUSION FOR HIGH POWER SEMICONDUCTOR LASER DIODE DIE BONDING

[75] Inventors: Scott Andrew Merritt, Vienna, Va.; Peter John Schultz Heim, Washington, D.C.; Mario Dagenais, Chevy Chase, Md.

[73] Assignee: University of Maryland, College Park, Md.

[21] Appl. No.: 08/673,222

[22] Filed: Jun. 27, 1996

[51] Int. Cl.[7] .................................................. H01L 23/488
[52] U.S. Cl. ........................... 438/106; 438/614; 438/615; 438/661
[58] Field of Search ..................... 228/123.1; 438/612, 438/614, 615, 661, 606, 106, 26; 257/772, 779

[56] References Cited

U.S. PATENT DOCUMENTS

| | | |
|---|---|---|
| 4,169,059 | 9/1979 | Storms ................................ 210/493 R |
| 4,360,965 | 11/1982 | Fujiwara .................................. 29/582 |
| 4,389,557 | 6/1983 | Deveni et al. ............................. 219/85 |
| 4,529,836 | 7/1985 | Powers et al. . | 
| 4,645,116 | 2/1987 | Henein et al. . |
| 4,645,166 | 2/1987 | Henein et al. ........................... 228/123 |
| 4,759,490 | 7/1988 | Ochiai ..................................... 228/124 |
| 4,904,610 | 2/1990 | Shyr ......................................... 438/15 |
| 4,930,001 | 5/1990 | Williams ................................... 357/71 |
| 5,046,656 | 9/1991 | Schmitt et al. . |
| 5,106,009 | 4/1992 | Humpston et al. . |
| 5,121,871 | 6/1992 | Beavis et al. . |
| 5,221,038 | 6/1993 | Melton et al. . |
| 5,234,153 | 8/1993 | Bacon et al. . |
| 5,242,099 | 9/1993 | Ueda . |
| 5,372,295 | 12/1994 | Abe et al. . |
| 5,448,014 | 9/1995 | Kong et al. ............................. 174/52.3 |
| 5,529,852 | 6/1996 | Sasame et al. .......................... 428/620 |
| 5,542,602 | 8/1996 | Gaynes et al. .......................... 228/175 |
| 5,816,473 | 10/1998 | Nishikawa et al. ...................... 228/6.2 |
| 5,854,087 | 12/1998 | Kurata ...................................... 438/26 |

OTHER PUBLICATIONS

Bernstein, "Semiconductor Joining by the Solid–Liquid–Interdiffusion (SLID) Process: 1 Ag–In, Au–In, and Cu–In", Journal of the Electrochemical Society, vol. 113, No. 12, pp. 1282–1288, Dec. 1966.

R. Boudreau et al., "Fluxless Die Bonding for Optoelectronics", 1993, IEEE, pp. 485–490.

*Primary Examiner*—Wael Fahmy
*Assistant Examiner*—Kurt Eaton
*Attorney, Agent, or Firm*—Watson Cole Grindle Watson P.L.L.C.

[57] ABSTRACT

A method and a resulting device for mounting a semiconductor to a submount by depositing a first layer of a first metal solder having a selected first melting point and corresponding thickness onto a surface of the semiconductor. Depositing a second layer of a second metal solder having a selected second melting point higher than the first melting point and a corresponding selected thickness onto a surface of the submount. Disposing the semiconductor surface and submount surface in confronting intimate contact and heating the submount and semiconductor to a temperature greater than the first temperature and lower that the second temperature for initiating and promoting liquid interdiffusion between the first and second solders.

24 Claims, 4 Drawing Sheets

CONTROLLED SOLDER INTERDIFFUSION FOR HIGH POWER SEMICONDUCTOR LASER DIODE DIE BONDING

BACKGROUND OF THE INVENTION

High power semiconductor lasers and semiconductor optical amplifiers have large heat fluxes, typically 4 kWatt/cm$^2$ or more, and are implemented in fragile material systems with moderate to poor thermal conductivity. This poses a significant device packaging challenge, because the die attach process must provide excellent heat transfer from the entire active area to the heatsink and must not produce excessive stresses (e.g., more than 20–50 MPa) on the die. The device packaging technology must also not degrade the quality of the emitted beam, which is ideally limited only by diffraction due to the finite size of the emitting aperture.

The thermal resistance of the die attach process is important because the threshold currents of semiconductor laser diodes and the gains available from semiconductor laser diode amplifiers are temperature sensitive. The temperature sensitivity of a semiconductor laser is quantified by the empirical expression:

$$I_{threshold}(T) = I_{threshold}(T_{ref}) \cdot \exp((T - T_{ref})/T_o) \quad (1)$$

where T is the temperature of the active region of the laser, $T_{ref}$ is a reference temperature, and $T_o$, is the characteristic temperature of laser threshold (an empirically-determined parameter which is itself dependent upon temperature and device geometry). As seen from equation (1), the most temperature sensitive semiconductor lasers, such as InGaAsP devices operating at 1.55 μm, exhibit low $T_o$ values (40 to 70° C.). Heat transfer from the active region is poor in optoelectronic devices because the thermal conductivity of the active region, substrate, and cladding layers is low. The substrate is typically 90 to 120 μm thick and the epitaxial layers containing the active region are typically 3 to 4 microns thick. It is thus necessary to mount the die with the epitaxial side toward the heatspreader or heatsink in order to minimize the thermal resistance. This so-called epi-side down mounting configuration reduces the yield of the die attach process because it greatly increases the chances of solder bridging the submicron thick, intrinsic active layer at the device sidewalls or facets. For GaAs/Al$_x$Ga$_{1-x}$As devices which are mounted epi-side down, the thermal conductivity of the Al$_x$Ga$_{1-x}$As cladding sets a lower limit on specific thermal resistance for the die attach method. For example, a broad area device with a t=1.5 μm thick cladding layer and a thermal conductivity of κ=11 Watt/(m° C.) (Al$_{0.5}$Ga$_{0.5}$As), and with negligible heat transfer through the substrate, will exhibit a specific thermal resistance of at least:

$$\rho = t/\kappa = 1.36 \cdot 10^{-3} \, K \cdot cm^2/Watt \quad (2)$$

A packaged high power semiconductor laser or optical amplifier must certainly have a low thermal resistance to reduce the average temperature of the die but must also be free of any significant localized heating or hotspots. Hotspots due to solder voids are especially problematic, because voids with diameters of even a few microns can lead to beam filamentation in high power devices and significantly degrade beam quality. Hotspots may also occur within about 5 μm of the facets of high power GaAs/AlGaAs devices and visible lasers. Localized heating, either at solder voids or at the device facets, places stringent requirements on the die positioning, interfacial flatness, heat spreading properties of the die attach process, and the design of the heatsink in high power devices.

Semiconductor lasers and amplifiers exhibit low fracture strength and are easily damaged by stress. For this reason, soft, low-melting temperature solders are often used to reduce the stress caused by the coefficient of thermal expansion (CTE) mismatch between the die and submount or heatsink. Soft solders, such as indium and indium-based alloys exhibit low yield stresses and are thus widely used for optoelectronic die attach. The slow, continuous deformation of these soft solders, known as creep, reduces the long term reliability of packages which are subjected to temperature cycling since fatigue occurs in the solder layer. Hard eutectic solders, such as 80-20 gold-tin, 88-12 gold germanium solder, and 97-3 gold silicon, show less creep and have higher yield strengths but also have higher melting temperatures and therefore cause significant stress in the die.

The requirements for heatspreading and stress minimization in optoelectronic packages are usually met by incorporating submounts between the semiconductor die and the heatsink. Type IIa natural diamond or high quality CVD diamond submounts may be used as well as silicon, cubic boron nitride or aluminum nitride. The heatspreading benefits of these submounts cannot be realized without a uniform, low thermal impedance die attach method.

The existing technology, however, is not free of voids in the semiconductor-solder interface. The existing technology results in poor process control, poor yield, high thermal impedance, and hotspots.

It is therefore desirable to provide a well-controlled, high yield, void-free die attach method for the epi-down mounting configuration of high power semiconductor lasers and optical amplifiers. Such a method should consistently yield absolute thermal resistances of about 1.5° C./Watt on tapered semiconductor optical amplifiers and specific thermal resistances of $4 \cdot 10^{-3}$° C. cm$^2$/Watt for lasers and optical amplifier devices. The method should result in wide process margins, exhibit excellent yield and repeatability, while relaxing the requirements on heatsink flatness and roughness. The method should desirably be well suited for laser die attach to heatspreading diamond submounts or advanced composite materials.

SUMMARY OF THE INVENTION

The invention is based upon the discovery that a semiconductor device may be attached to a submount in an epi-down configuration by depositing a patterned thin-film of a first metal solder layer on the semiconductor and depositing a thin-film second metal solder layer on the submount. The second metal layer has a melting point higher than the first metal. The semiconductor is placed on the submount with the first and second metal layers in contact forming a junction. While the assembly is held together under pressure, heat is applied to raise the temperature above the melting point of the first layer and below the melting point of the second layer whereby the first layer interdiffuses into the second layer at the junction and laterally without melting the second layer, thereby forming a fillet-free bond of minimal thickness. The interdiffusion is driven in the direction of the eutectic composition resulting in a bonding layer of minimal thickness and controlled volume. The die attach method according to the invention results is a bonding layer or attach of relatively low and reproducible specific thermal resistances in semiconductor lasers and optical amplifiers.

In a particular embodiment, the method is based on the controlled interdiffusion of a first solder layer of one metal evaporated on an oxygen free high conductivity (OFHC) heatsink with a second solder layer of another metal with a lower melting temperature than the first metal evaporated on the epitaxial side of the semiconductor wafer. The product produced by the method has a bond which is intrinsically free of voids in the semiconductor epitaxial-to-solder interface, because solder is evaporated directly on the epitaxial surface of the semiconductor. This method is particularly effective in high power devices because it ensures that voids do not occur adjacent to the heat producing, active region of the die. The interdiffusion method relaxes the requirements on heatsink smoothness and enables precise control of the solder volume and reflow characteristics.

In an exemplary embodiment, the first layer is a $2.5\mu$ layer of indium and the second layer is a $2\mu$ layer of tin, and the copper heatsink is an OFHC. The layer thicknesses are selected to achieve a slightly indium-enriched indium-tin alloy (as compared with the eutectic composition of 50.9 wt % indium-49.1 wt % tin, which has a melting point of 118° C.) if the two layers are completely interdiffused. The gold metallization on the epitaxial side is restricted to about 10% of the indium thickness to prevent the formation of the brittle, thermally resistive $Au_9In_4$ intermetallic compound or other high-melting temperature indium-gold phases. In an exemplary embodiment, the indium layer is about 1500 Å.

An exemplary embodiment of the invention utilizes a layer of indium (at least one micron thick) deposited on the epitaxial side of a semiconductor wafer (or wafer section). This epitaxial side metal layer is patterned either during the deposition process or subsequent to the deposition to create solder-free lanes at the periphery of the die. These lanes are locations for the subsequent cleaving and dicing steps. The epitaxy-side solder layer is coated with a thin, conformal layer of dilute flux or otherwise treated with a protective layer (such as electroplated gold) to inhibit or reduce oxide formation during storage and until the die bonding thermal cycle occurs. The two solder surfaces are treated separately prior to solder reflow. After dicing, the flux improves the wetting of the metal surfaces to be joined while inhibiting wicking of the reflowed solder on unmetallized die surfaces. The invention may also be used without flux by storing the solder-coated semiconductor and heatsink in an oxygen-free environment, for example, usually nitrogen. Flux-free die attach may also be achieved in a reducing atmosphere of forming gas for some types of solder.

A second solder layer of tin, which has a higher melting temperature than the first solder layer, is deposited on the heatsink. The second solder layer may also include metals not usually thought to be solder, i.e., gold. The thickness of each solder layer is chosen to be near an eutectic composition of the binary alloy. The surface of the second solder layer is prepared for the die attach thermal cycle by buffing or an oxide-removal process. According to the present invention, the binary solder alloy is thus generated locally, under die. The coverage of the alloyed solder is controlled by the initial pattern in the first solder layer possessing the lower melting temperature, the time and temperature of the die attach cycle, and the pressure applied during the thermal cycle.

Alternative forms of the invention may utilize other metals, including but not restricted to, other alloy systems such as In/Au, Ag/Sn, Pb/Sn, Au/Ga, In/Pb. For example, a layer of tin may be deposited on the epitaxial surface of the wafer, and gold, multilayer gold-tin, or a gold-tin binary alloy may be deposited on the heatsink.

According to the present invention, precise control of the final composition and volume of the alloyed solders and the physical properties of the solder alloy during the die attach thermal cycle can be adjusted by varying the thickness of the first and second solder layers. For example, the thickness of the first and second solder layers can be adjusted so that, during a low temperature die attach a thermal cycle, only a portion of the first solder layer alloys with the second. In the In/Sn system, the thickness of the tin on the heatsink can be reduced so that only a portion of the indium alloys with the thin layer of tin. This reduces the volume of alloyed solder that may exude from beneath the die resulting in a fillet free bond, thereby reducing the chance of an electrical short occurring at the facets or sidewalls of the die. Alternatively, a further reduced thickness of the indium may be employed to reduce the volume of alloyed solder coupled with a higher temperature for the die bonding thermal cycle.

DESCRIPTION OF THE INVENTION

Figure 1:
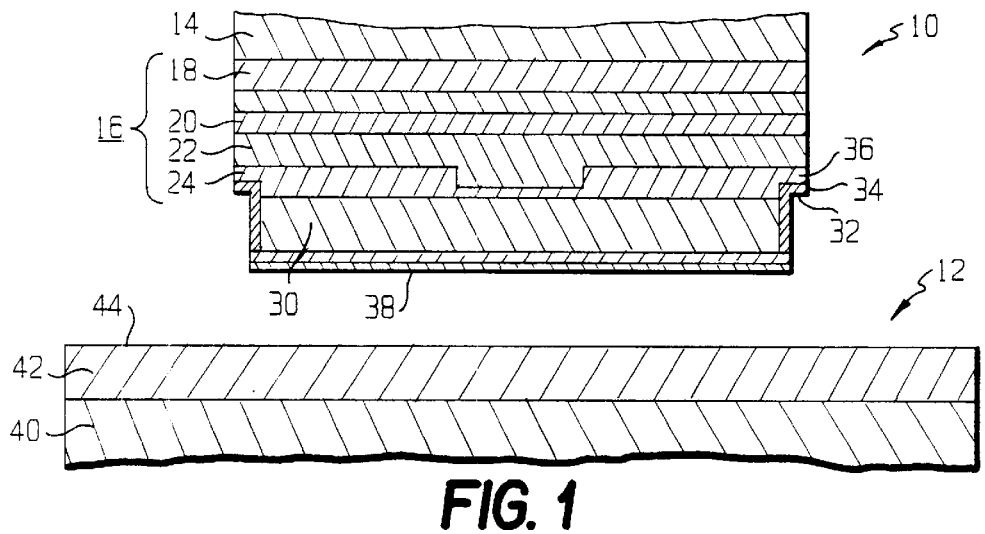
FIG. 1 is an exploded side view of a die and submount disposed for bonding in accordance with the invention.
Figure 2A:
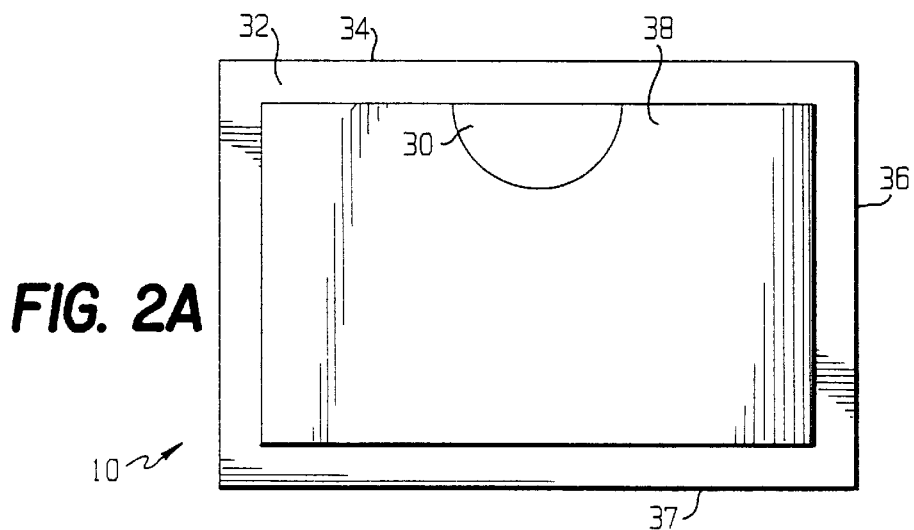
FIG. 2A is a plan view of the epitaxial side of the die shown in FIG. 1.
Figure 2B:
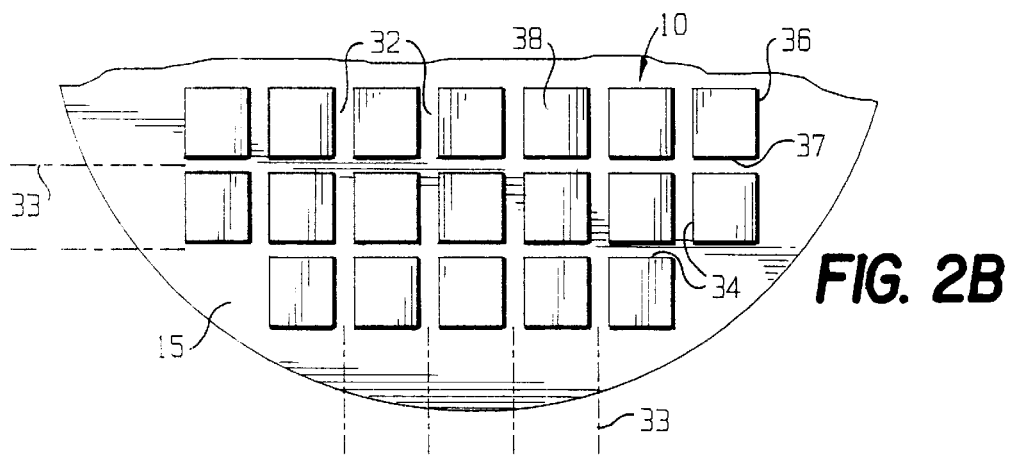
FIG. 2B is a fragmentary plan view of the epitaxial side of a wafer prepared in accordance with the invention with dotted lines indicating die cut lines for dicing and cleaving.

FIGS. 1 and 2A–2B illustrate an exemplary embodiment of the invention for bonding a semiconductor 10 to a submount 12. The semiconductor 10 may be any one of a number of devices, for example, a laser diode in the form of a substrate 14 diced from a wafer 15. The substrate or die 14 is formed with an overlying layered structure 16 including an N-clad layer 18, an intermediate active layer 20 and overlying P-clad region or layer 22. A dielectric layer 24 is formed over the P-clad layer 22.

According to the invention, a first metal solder layer 30 is deposited onto the dielectric layer 24. The first solder layer 30 may be deposited by evaporation, plating, CVD, or other suitable method to produce a patterned thin-film layer having a thickness in the range of about 1 to 4 micrometers. During deposition, a portion of the dielectric layer 24 may be suitably processed to expose lanes 32 adjacent marginal edges of the die. The lanes 32 define dicing or cleaving locations for cut lines 33 (FIG. 2B). More importantly, however, the lanes 32 result in a first solder layer 30 which is completely within the margins 34 of the die 10 and which tends not to extend to the marginal edges which are the device sidewalls 36 which expose the active layer structure. Such an arrangement reduces the possibility of short circuiting the device 10 and thereby increases yield. An oxide control layer consisting of a flux layer 38, or a thin protective gold layer may be formed on the first solder layer 30 to reduce or prevent oxides and thus improve bonding as hereinafter discussed.

In a layer, the sidewalls 36 may be formed by a known dicing technique. The end walls 37 may be formed by cleaving which results in a faceted wall forming a mirrored end of the layer. The open lane thereby provides not only a cleaving lane but also helps to concentrate stress during the cleaving operation, wherein the edge of the wafer is nickel and the wafer is shaped over a knife edge along the end wall 37.

The submount 12 comprises an oxygen free high conductivity (OFHC) copper, copper/tungsten, or other alloy heatsink or submount 40 formed with a second metal solder layer 42 deposited thereon. The second solder layer 42 may be a thin-film deposited by evaporation, CVD, plating or other suitable method to a thickness in a range of about 1 to 4 micrometers, although a thicker solder layer 42 is tolerable. The thickness of the first and second solder layers 30 and 42 may be selectively chosen so that the resulting binary alloy, hereinafter described, approaches an eutectic.

A surface 44 of the second solder layer 42 may be lightly buffed prior to bonding to remove any oxide prior to bonding which may interfere with the interdiffusion process of the invention. Alternatively, a suitable oxide control layer 43 of, for example, a flux layer or thin gold, may be provided.

The first solder layer 30 is a low temperature solder (LTS) material L having a melting temperature TL. The second solder is a high temperature solder (HTS) of a material H having a melting point TH. In accordance with the invention, melting point TL is less than TH. As hereinafter described, the bonding temperature TB is chosen to initially be near TL and less than TH. It should be noted that interdiffusion may occur by simply contacting the two solder layers at a temperature near but less than TL. However, this is a more time consuming process.

Figure 3:
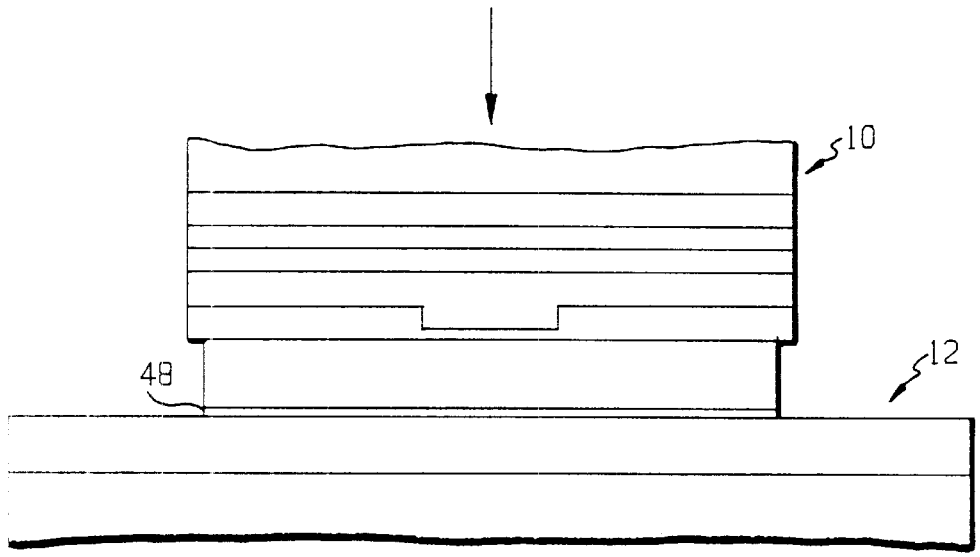
FIG. 3 is a side view of the die and submount disposed for bonding.
Figure 4:
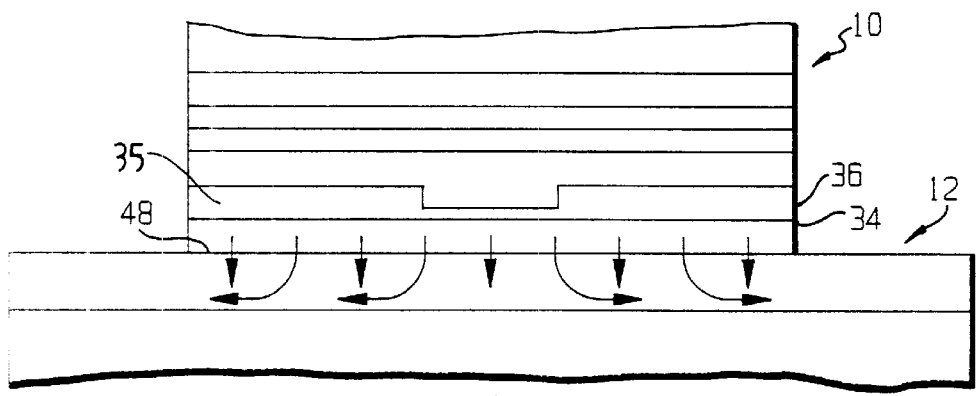
FIG. 4 is a side view of the arrangement of FIG. 3 after application of heat and pressure sufficient to effect bonding.

The process for bonding the die 10 to the submount 12 is illustrated in FIGS. 3 and 4. The die 10 is disposed in an epi-down configuration with the first solder layer 30 in contact with the second solder layer 42 forming a junction 48 therebetween. The pressure may be applied by a suitable fixture to urge the die 10 and the submount 12 into close intimate contact (FIG. 3). Similarly, heat, indicated by the arrows H, may be supplied by a suitable source to cause the temperature of the die 10 and submount 12 to increase to near the melting point TL of the first solder layer 30 but below the melting temperature of the second solder layer 42. The material L forming the first solder layer 30 thereby becomes molten and interdiffuses into the solid unmolten or second solder layer 42. The first layer 30 diffuses and extrudes laterally towards the marginal edges of the die 10 (as indicated by the arrows P). As a result, the patterned lanes 32 are essentially eliminated. However, the molten first solder layer 30 does not extrude appreciably beyond the marginal edges 34 and upon the sidewalls. Accordingly, when the heat is removed, the first solder layer solidifies without forming a fillet between the second solder layer 42 and the die 10. Thus, solder does not wick along with sidewalls 36 of the die 10 beyond the dielectric layer 24 and into the P-clad region 22, thereby reducing the possibility of a short.

Figure 5:
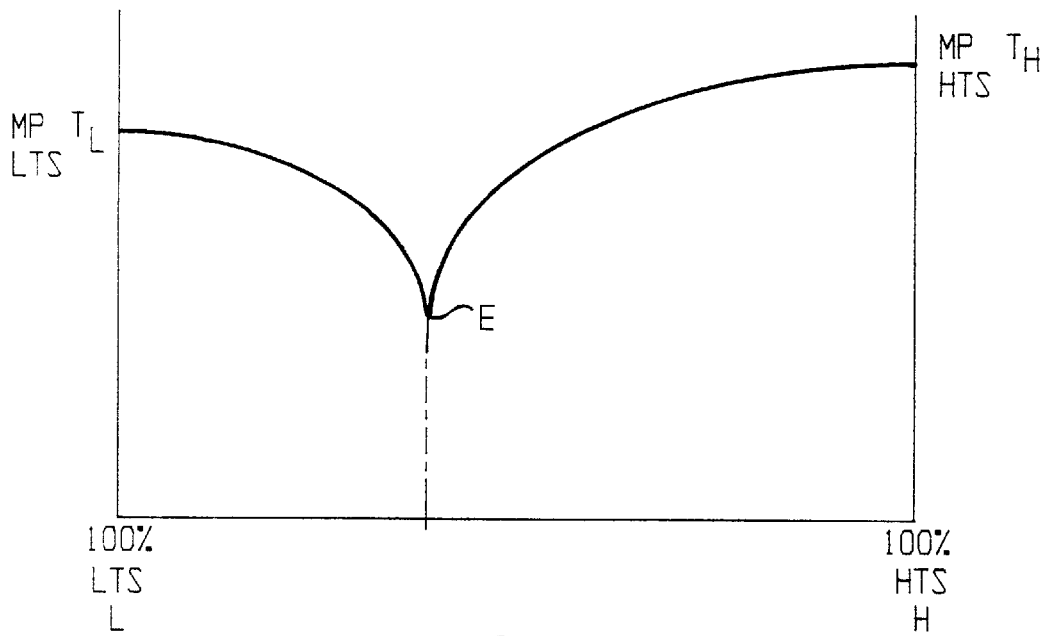
FIG. 5 is a generalized schematic illustration of a phase diagram for a binary alloy system with a single eutectic composition.

As heat is applied near the melting point of the low temperature material L, the first solder layer 30 and the second solder layer 42 form an interdiffusion zone 50 which comprises an alloy of the solder materials L and H. The resulting binary alloy 52 is a material having a characteristic which tends towards the eutectic. See, for example, FIG. 5, which schematically illustrates an exemplary phase diagram of a binary system L/H comprising the materials L and H having eutectic E. As heat is applied near TL, the low temperature solder interdiffuses with the high temperature material H. As this occurs, a binary alloy L/H is formed at the junction 48. As can be appreciated, the binary alloy L/H has a melting temperature lower than either of the materials alone. Thus, liquid interdiffusion occurs. The melting point of the binary alloy L/H decreases, which in turn promotes further liquid interdiffusion. The process continues until the low temperature material L is essentially consumed or alloyed into the high temperature material H. The amounts of L and H can be selected, for example, by volume or deposition thickness, to result in an eutectic or near eutectic composition. This is achieved by depositing onto the die a selected volume of low temperature material L for the first solder layer 30 and any separate excess amount of high temperature material H for the second solder layer 42 onto the submount 12. The low temperature material L tends to be consumed by interdiffusion in the high temperature material H. It should be understood that L and H are not limited to single component systems. For example, an In/Pb/Sn system may be employed.

Prior systems tend to move away from the eutectic thereby resulting in problems with yield and stability. In the present invention, heat drives the system of the separately deposited layers 30 and 42 towards the eutectic. Accordingly, more of the low temperature material L is consumed, i.e., diffused into the high temperature material H, resulting in reduced thickness in the interdiffusion zone 50. As a result, the overall thickness of the material located directly below the die is reduced to a minimum. This in turn improves heat conduction between the die 10 and the heatsink 40.

It can be further appreciated that the tendency of the first solder layer 30 to interdiffuse into the second solder layer 42 with the resulting reduction in the thickness of the binary solder layer improves the aging characteristic of the device. Over time, as the temperature of the system increases for whatever reason, lateral interdiffusion of the first solder material with a low temperature solder material L continues. This tends to further reduce the thickness of the alloy layer, which in turn improves thermal efficiency. As a result, the bonded device tends to age in a manner which promotes thermal efficiency as opposed to a manner in which thermal efficiency decreases with age. In effect, the bond and thermal efficiency becomes more robust with age.

A general discussion of the design of a multilayer eutectic solder allow follows. Consider, for example, a multilayer design for a solder alloy of total thickness T, consisting of N materials. The thicknesses, $t_1$ (I–1 . . . N), of the individual layers are calculated using the densities, $\rho_1$, and weight percentages, $Y_1$, of the desired alloy. In the case of four constituents (N=4), the layer thickness is given by:

$$\begin{bmatrix} t_1 \\ t_2 \\ t_3 \\ t_4 \end{bmatrix} \begin{bmatrix} \rho_1\left(\dfrac{\gamma_1-1}{\gamma_1}\right) & \rho_2 & \rho_3 & \rho_4 \\ \rho_1 & \rho_2\left(\dfrac{\gamma_2-1}{\gamma_2}\right) & \rho_3 & \rho_4 \\ \rho_1 & \rho_2 & \rho_3\left(\dfrac{\gamma_3-1}{\gamma_3}\right) & \rho_4 \\ 1 & 1 & 1 & 1 \end{bmatrix}^{-1} \begin{bmatrix} T \\ O \\ O \\ O \end{bmatrix} \quad (3)$$

This equation may be used to design the overall composition of a multilayer metallization. In addition, the equation may be used in conjunction with the phase diagram of the alloy to partition the multilayer design into a melting temperature alloy on the die and a high melting temperature alloy on the heatsink or heatspreader. The final alloy composition is determined by the extent of the interdiffused region.

As an example of a design which not partitioned into separate compositions for the die and the heatsink, consider an indium-lead-silver system. The densities of the constituents are 7.31, 11.34 and 10.49, respectively. Using an indium-lead-silver alloy with the proportions 80, 15 and 5 weight %, to form a 3 µm thick solder alloy would consist of 2.58 µm of indium, 0.31 µm of lead, 0.11 µm of silver.

As an example of a design partitioned into separate compositions for the die and the heatsink, consider the gold-tin system. The density of gold and tin are 19.3 and 7.31, respectively. The composition of the gold-tin alloy would be 85-15 w/o Au—Sn if fully alloyed (note that this alloy is gold-rich compared to the 80-20 eutectic). This composition yields overall thicknesses of 2.0 µm for gold and 1.0 µm for tin. One could position all of the tin on the die with 80 nm of gold used as wetting and capping layers; this comprises a 17–83 wt % Au—Sn alloy with a melting temperature of 240° C. The remainder of gold (1.92 µm) may be allocated to the submount.

It is important to note that in the above example, substantial interdiffusion occurs in-situ during the evaporation of the solder alloy layers; i.e., the solder may thus not really be a multilayered structure but may be a binary system. In situ diffusion occurs in the deposition of many solder alloys such as gold-tin, indium-lead, and indium-gold, even when these materials are separated by fractionation during thermal evaporation. Thus, the low temperature and high temperature solder layers may be elemental or alloys. This fact should be kept in mind when selecting the thickness of the last capping layer with the intention of preventing oxidation of the underlying alloy.

EXAMPLE

An example of the invention illustrates the controlled interdiffusion of a 2.0 µm tin layer evaporated on an OFHC copper heatsink with 2.5 µm of indium evaporated on the epitaxial side of a semiconductor wafer. This method is intrinsically free of voids in the semiconductor epitaxial-to-solder interface since solder is evaporated directly on the epitaxial surface of the semiconductor. This approach is especially important in high power devices since it ensures that voids cannot occur adjacent to the heat producing, active region of the die. The interdiffusion method relaxes the requirements on heatsink flatness and roughness and enables precise control of the solder volume and reflow characteristics. In this example, the layer thicknesses were designed to achieve a slightly indium-enriched indium-tin alloy, as compared with the eutectic composition of 50.9 wt % indium-49 wt % tin, which has a melting point of 188° C. The gold metallization on the epitaxial side of the wafer is thin, less than about 1500 Angstroms, or up to about 10% of the thickness of the indium layer to prevent the formation of the brittle, thermally resistive $Au_9In_4$ intermetallic compound or high melting temperature indium-gold phases, as shown in the indium-gold phase diagram.

After 2.5 µm of indium was deposited on the wafer, it was photolithographically pattered and etched to create cleaving and dicing lanes. These lanes define the periphery of the dice and were 20 µm wide near the facets and 60 µm near the sidewalls. A $Kl/I_2$ solution was used which was prepared by dissolving 112 grams of potassium iodide and 57 grams of iodine in 100 ml of distilled water to etch the exposed indium. After etching and rinsing, the photoresist was removed using acetone and photoresist stripper. The wafer was coated at 4000 rpm for 40 seconds using a photoresist spinner with a solution of 1 volumetric unit of Indium Corporation's #5 RMA flux and 10 volumetric units of methanol. It was determined that the flux thickness was best controlled by changing the flux dilution, as opposed to the spinner speed. After flux-coating, the wafer was baked for 10 minutes at 90° C.; this drove off the methanol and resulted in a flux layer that was very thin (0.4 µm or less), uniform and conformally coated the indium on the wafer (FIG. 1). The final flux thickness t was related to the volumetric dilution (1:d) according to the following empirical expression:

$$t = 3.2/d^{0.9} \quad (4)$$

where "t" was measured in microns. After cleaving and dicing, the devices were positioned using a Vespel vacuum tool.

During the die bond thermal cycle, the surface temperature of the heatsink was raised to the melting point of indium (157° C.) but was not allowed to reach the melting point of tin (232° C.). This greatly reduced the chance of solder wetting and shorting the device and accounted for the high yield we obtained with this method. As the heatsink surface temperature approached the melting point of indium, the indium on the die began to interdiffuse and alloy with the tin on the heatsink or heatspreader. Since the melting temperature of the locally generated alloy was less than that of pure indium, per the binary phase diagram for the indium-tin alloy, the interdiffusion region enlarged and interdiffusion rate of the two metals increased until the solder bond was complete. The final thickness of the bond was a function of the duration of the die bond thermal cycle and pressure applied by the Vespel tool (approximately 1 MPa).

Figure 6:
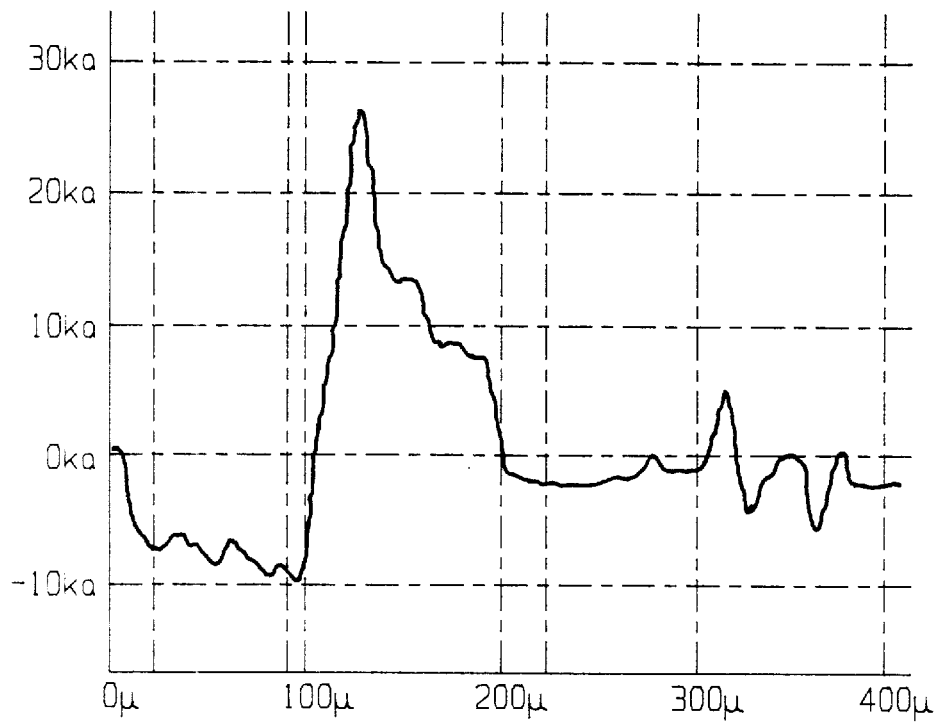
FIG. 6 is a profilometer trace of a heatsink surface after partial removal of the semiconductor die.

Micrographs of the die bonded devices showed a substantial portion of the indium was transferred laterally from beneath the die under the influence of interdiffusion, compression of the die to the heatsink, and solder alloy surface tension. These effects produced a thinner and less thermally resistive solder layer beneath the die than would otherwise be possible. FIG. 6 shows the effect of interdiffusion thinning and exudation of the solder. (The portion of the scan for horizontal positions between 200 µm and 400 µm consisted of unmelted tin on the heatsink surface.) This die was intentionally fractured to profile the sample.

Heatsink Design

Figure 7:
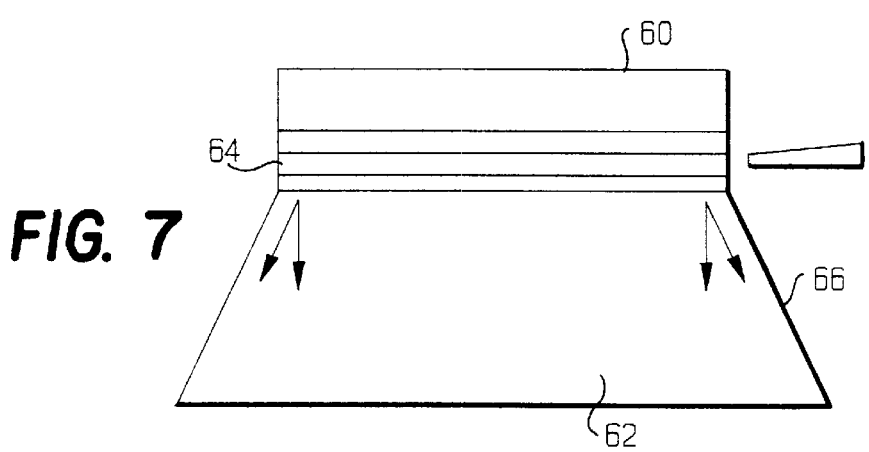
FIG. 7 is a side sectional view of a beveled, wedge shaped, OFHC heatsink supporting a high power angled facet traveling wave amplifier.

FIG. 7 shows a side sectional view of a laser or amplifier 60 mounted on an OFHC heatsink 62 by means of a bonding layer 64 according to the invention. The heatsink 62 has bevels 66 and 68 to increase the thermal mass directly beneath the laser or amplifier facets to reduce the temperature rise due to laser facet heating. The bevels 66 and 68 were declined 60 degrees with respect to vertical to allow for the high beam divergence angles exhibited by laser diodes with small transverse spotsizes. Smaller bevel declination angles are possible and desirable for devices with larger spot sizes and reduced diffraction angles. The heatsink ridge was oriented 24° with respect to the major heatsink facets to allow the input and output beams of the amplifier to propagate normal to the major heatsink facets.

The controlled solder interdiffusion method eliminated the need for ultraflat, mirror polished heatsinks for high power devices. We found that surface roughness measurements need not be less than 100 nm Ra and that some roughness was desirable to promote adhesion of the solder deposited on the heatsink. Careful attention must still be paid to the flatness of the mounting surface, however, our technique enables the tradeoff between heatsink smoothness and flatness to favor improved flatness.

Thermal Resistance Results

Figure 8:
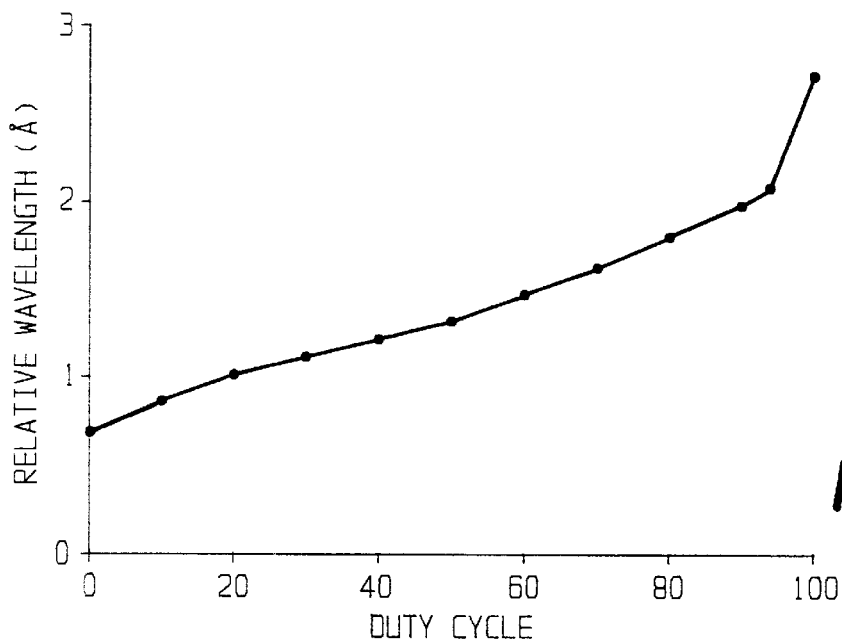
FIG. 8 is an illustration of wavelength shift versus duty cycle for a GaAs/AlGaAs broad area laser.
Figure 9:
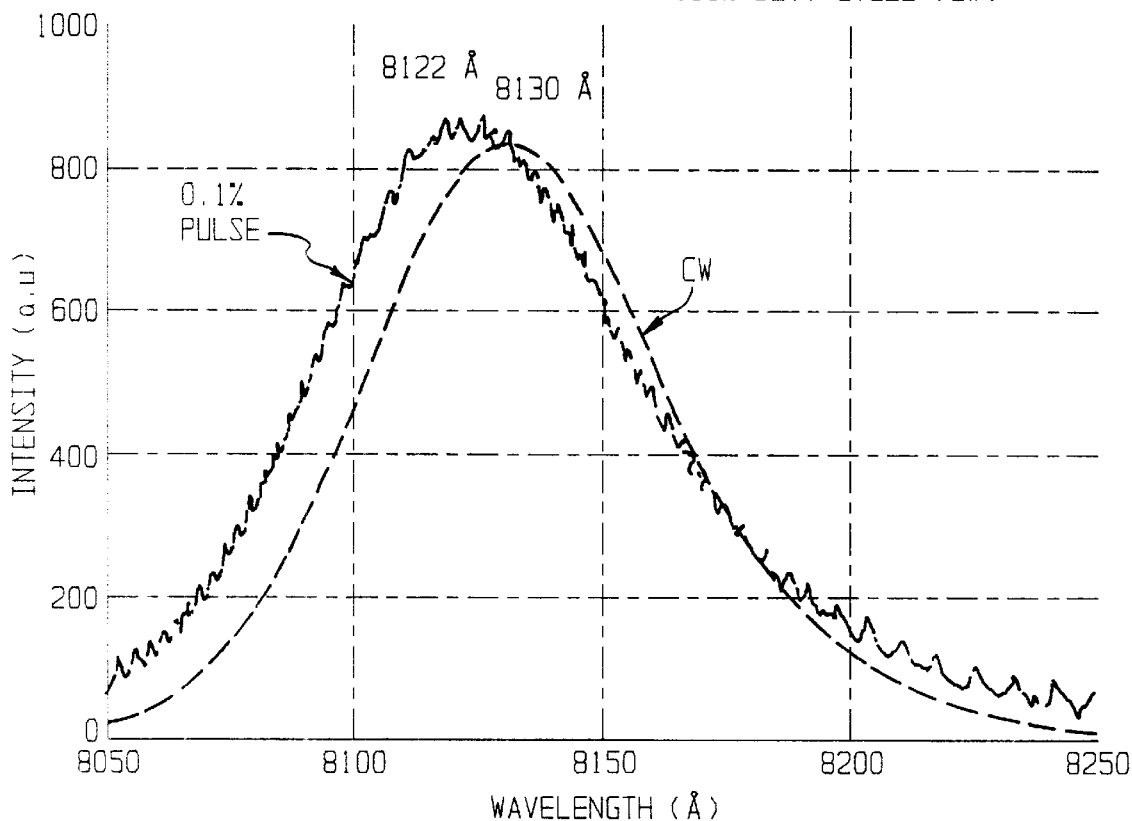
FIG. 9 is an illustration of wavelength shift versus duty cycle for a GaAs/AlGaAs optical amplifier at 0.1% (pulsed duty cycle) and 100% (CW).

FIGS. 8 and 9 illustrate the measured thermal resistance of broad area lasers and optical amplifiers using the Paoli method which relates the shift in wavelength of a laser diode as a function of applied power to the active region temperature. The power applied to the device was determined by the diode voltage-current product times the duty cycle, which was varied from 0.1% to 100% (CW). The active region temperature was calibrated by measuring the laser diode wavelength as a function of heatsink temperature. According to FIG. 9, the wavelength shift from 0.1% duty cycle to CW operation was 0.21 nm, the applied power was 760 mW, and the Fabry-Perot mode shift was 0.068 nm/°K; this yielded a thermal resistance of 4.0° C./Watt. For the tapered amplifier in FIG. 11, the wavelength shift from 0.1% duty cycle to CW operation was 0.81 nm, the applied power was 2 Watts, and the gain shift was 0.293 nm/°C.; this yielded a thermal resistance of 1.4° C./Watt. Specific thermal resistances were calculated from the measured thermal resistances and the active area of the devices. The mean specific thermal resistance of broad area lasers was small ($4.0 \cdot 10^{-3}$° C.cm$^2$/Watt) and has a small standard deviation ($5.0 \cdot 10^{-1}$° C.cm$^2$/Watt). Nearly identical specific thermal resistances were obtained on 2 mm long angled-facet tapered power amplifiers operating at 810 nm and 970 nm. These amplifiers consistently achieved thermal resistances of between 1.4 and 1.6° C./Watt.

The invention has a number of important advantages. For example, the invention greatly reduces the possibility that the solder will wet or short the facets or sidewalls of the semiconductor die because the volume of solder is precisely controlled and the temperature at the soldered surface of the heatsink is kept below the melting temperature of the second solder during the die attach thermal cycle.

The invention has very wide process latitude, i.e., acceptable compositions of the alloyed solder can be achieved over a wide range of temperatures. The interdiffusion of the two solder layers can be achieved by liquid phase diffusion or solid phase diffusion, or by a combination of these two diffusion mechanisms.

The invention enables separate oxide control and/or removal steps to be utilized for the two solders prior to the die attach thermal cycle.

An ultra-thin, conformal flux coating is achieved by dilution and spin coating on the sample. This flux coating reduces oxides locally, improves heat transfer between the two solder-coated parts locally and affects the surface tension of the solder and solder alloys locally (i.e., starting beneath the die) and so contributes to wetting and alloying of the solder layers. At the same time, the flux appears to inhibit wetting of the unmetallized surface. The thickness of the flux coating is adjustable by changing the dilution or spin speed.

The final thickness of the alloyed solder can be less than other methods, while achieving high yield and low thermal impedance. The final solder thickness can be less than the thickness of both solder layers or either solder layer separately due to mass transport from the joint during the bonding cycle.

The patterned solder on the semiconductor facilitates cleaving the semiconductor at or near the desired locations by stiffening the wafer or wafer section. Alternatively, the solder on the semiconductor may be patterned to create solder-free lanes near some but not all edges of the die.

In an alternative form of the inveniton, a solder layer could be placed on the bottom of the wafer or substrate, rather than epitaxy, side of the semiconductor.

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

What is claimed:

1. A method for mounting a semiconductor to a submount comprising the steps of:

depositing a first layer of a first metal solder having a selected first melting point and corresponding thickness onto a surface of the semiconductor;

depositing a second layer of a second metal solder having a selected second melting point higher than the first melting point and a corresponding selected thickness onto a surface of the submount;

disposing the semiconductor surface and submount surface in confronting intimate contact; and heating the submount and semiconductor to a reflow temperature lower than the second temperature for initiating formation of an alloy by liquid interdiffusion between the first and second solders such that the alloy has a resulting melting point less than the first temperature.

2. The method of claim 1 wherein the semiconductor comprises a laser diode.

3. The method of claim 2 wherein the surface of the semiconductor comprises an epitaxial side.

4. The method of claim 1 wherein the first and second solder layers form a junction and wherein the initiation of interdiffusion of the first and second solders promotes further interdiffusion and causes the formation of a composition to approach a eutectic composition.

5. The method of claim 1 wherein the alloy is formed in an interdiffusion layer between the first and second metal solder layers, and the interdiffusion layer is substantially void free.

6. The method of claim 1 wherein the interdiffusion between the first and second metal solder layers occurs without formation of a fillet between the semiconductor and the submount.

7. The method of claim 1 wherein the thickness of the respective first and second layers is near a eutectic for the first and second solders.

8. The method of claim 1 wherein the first solder is indium having a selected thickness and further comprising depositing an intermediate layer of gold between the indium and the semiconductor having a thickness up to about 10% of the thickness of the indium layer to prevent the formation of brittle thermally resistant gold-indium intermetallic compounds.

9. The method of claim 8 wherein the indium has a thickness of about 2.5 $\mu$m and the gold has a thickness up to about 1500 Å.

10. The method of claim 1 further comprising depositing a protective layer on the first solder layer.

11. The method of claim 10 wherein the step of a depositing protective layer comprises depositing a conformal layer of flux to inhibit the formation of oxides on the first solder layer.

12. The method of claim 1 further comprising abrading the second layer prior to the heating step.

13. The method of claim 1 further comprising removing oxides from the second solder layer prior to the heating step.

14. The method of claim 1 wherein the semiconductor comprises a wafer formed with a plurality of semiconductor circuits thereon and the deposition step for the first solder layer comprises depositing of said solder layer in defined areas on the wafer and forming solder-free lanes between the circuits.

15. The method of claim 14 further comprising dicing the wafer along with solder-free lanes to produce individual semiconductor dies.

16. The method of claim 1 further comprising selecting the first solder layer from the group consisting of indium, silver, lead and gold.

17. The method of claim 1 further comprising selecting the second solder layer from the group consisting of gold, tin, gallium and lead.

18. The method of claim 1 wherein the first and second solders form a binary alloy, a ternary alloy or a greater alloy.

19. The method of claim 1 wherein the interdiffusion forms a layer having a thickness less than the sum of the thickness of the first and second layers.

20. The method of claim 19 wherein the layer has a thermal resistance of lower than or equal to 1.5° $C.cm^2/W$.

21. The method of claim 20 wherein the layer has a thermal resistance of about $4 \times 10^{-3}$° $C.cm^2/Watt$.

22. The method of claim 1 wherein the submount comprises an oxygen-free high conductivity copper or Cu/W heatsink.

23. The method of claim 1 wherein the first and second solder layers comprise one of an element and an alloy.

24. A method for mounting a semiconductor to a submount comprising the steps of:

depositing a first layer of a first metal solder having a selected first melting point and corresponding thickness onto a surface of the semiconductor;

depositing a second layer of a second metal solder having a selected second melting point higher than the first melting point and a corresponding selected thickness onto a surface of the submount;

disposing the semiconductor surface and submount surface in confronting intimate contact; and heating the submount and semiconductor to a reflow temperature near the first temperature and lower than the second temperature for initiating formation of an alloy defining a solidus liquidus temperature V composition by liquid interdiffusion between the first and second solders said liquid interdiffusion of the solders causes the composition of the alloy to change such that the difference between the reflow and solidus liquidus temperature increases.

* * * * *